United States Patent
Gonsalves et al.

[19]
[11] Patent Number: 5,901,047
[45] Date of Patent: May 4, 1999

[54] COMPUTER CHIP SPACER ELEMENT

[75] Inventors: Daniel D. Gonsalves, Hudson, N.H.; Paul D. Welch, Milpitas, Calif.; Lance E. Terry, Fremont, Calif.; Leonardo Sandman; Kia-Pin A. May, both of Cupertino, Calif.

[73] Assignee: Sun Microsystems, Inc., Mountain View, Calif.

[21] Appl. No.: 08/668,586

[22] Filed: Jun. 20, 1996

[51] Int. Cl.⁶ .................................................. H05K 3/34
[52] U.S. Cl. ........................ 361/770; 361/783; 361/804; 174/138 G; 29/840; 29/843; 228/180.1
[58] Field of Search ..................... 361/719, 767, 361/770, 771, 783, 804; 257/697, 717, 725, 686; 174/138 G; 29/840, 843; 228/180.1, 215

[56] References Cited

U.S. PATENT DOCUMENTS

| | | | |
|---|---|---|---|
| 3,467,937 | 9/1969 | Norton | 338/219 |
| 3,805,212 | 4/1974 | Landman et al. | 361/767 |
| 3,932,934 | 1/1976 | Lynch et al. | 29/843 |
| 5,255,159 | 10/1993 | Seyk | 361/770 |
| 5,625,227 | 4/1997 | Estes et al. | 361/719 |
| 5,770,889 | 6/1998 | Rostoker et al. | 257/698 |

OTHER PUBLICATIONS

Polymer Technology Dictionary, Tony Whelan, cons., Chapman & Hall, pp. 10–11 (acetal), 1994.

Concise Encyclopedia of Polymer Science and Engineering, J.I. Kroschwitz, ed., Wiley & Sons, pp. 4–5 (Acetal Resins), 1990.

Electronic Materials and Processes Handbook, 2nd ed., C.A.Harper & R.N.Sampson,eds., pp. 1.21–1.22,7.23–7.25, 1994.

*Primary Examiner*—Leo P. Picard
*Assistant Examiner*—John B. Vigushin
*Attorney, Agent, or Firm*—Blakely Sokoloff Taylor & Zafman

[57] ABSTRACT

The disclosed invention relates to the employment of a spacer element for mounting, aligning and spacing a computer chip relative to a PCB. The spacer element is formed and dimensioned to engage the chip in a manner to assure that the pins of the chip are properly aligned relative to openings in the PCB and to assure that the chip is centered and maintained parallel to the PCB and each of its pins maintained equal distance from the underneath side of the PCB during the wave soldering process for electrically connecting the chip and PCB.

7 Claims, 3 Drawing Sheets

COMPUTER CHIP SPACER ELEMENT

BACKGROUND OF THE INVENTION

The present invention relates to an improved computer system and more particularly to an improved computer chip-printed circuit board (PCB) assembly and a method of mounting a chip on a PCB.

The present invention is addressed, in one case, for example, to improving the manner and method in past systems of securing the chip, usually a processor, to the PCB, usually a motherboard, which in certain past systems employed a socket. In this system the socket is mounted on the PCB and then secured thereto by a wave soldering process. The socket is provided with well known pin openings that received corresponding pins mounted in the underneath surface of the chip and by which construction the desired electrical circuits are established and maintained between the two elements.

The employment of a socket in this design creates problems in obtaining an effective and quick way for the proper placement, alignment and spacing of the socket on the PCB. Because of these drawbacks the pins are sometimes bent during their insertion resulting in an unusable assembly. Moreover, in the system employing a socket a special tool in the form of a press is required to seat the chip into the socket. Usually the fastening is accomplished by a "push fit" between the pins of the chip and the openings in the socket.

In addition to the limitations of the present day design employing a socket, its use even when the limitations are controlled within acceptable bounds represent a significant added expense to the manufacturing cost as it relates to the means and method of wave soldering the socket to the PCB and in mounting the chip in the socket.

Both in the use of sockets as described above and in arrangements where the chip is mounted directly on the PCB by wave soldering, similar to that of the present invention, there exist a problem of maintaining the ends of all of the pins that pass through openings in the PCB the same distance from the bottom surface of the PCB and the ends within a common plane parallel to such surface. The failure to do this creates problems during the wave soldering process in obtaining the proper soldering of each pin with the PCB and allows the creation of what is referred to as "solder bridging", where because of the unevenness and slope of the pins during the wave soldering process solder is deposited between adjacent pins resulting in the creation of an objectionable short circuiting condition in the chip.

BRIEF DESCRIPTION OF THE INVENTION

The present invention relates to the use of an insert element between the chip and PCB and the elimination of the use of a socket, as described above and its attending drawbacks, and in the case where the chip is wave soldered to the PCB a desired placement, alignment and spacing of the chip relative to the PCB and the reduction if not elimination of the solder bridging condition.

More particularly, the invention provides a spacer element adaptable to be interposed between the underneath surface of a chip, the chip being for example a processor, and the PCB, the spacer element being designed to assure proper and easy placement of the element on the PCB, the proper alignment of the pins of the chip with the assigned holes of the PCB, and the proper extending tail lengths of the pins relative to the underside of the PCB, without requiring any alteration in the design of the existing chip to accomplish such use.

An additional characteristic of the invention is to provide one or more portions of a surface of the spacer element to engage one or more cooperative portions of a surface of the chip to hold these elements in their operative cooperative positions during their assembly on the PCB.

A still further feature of the invention is to provide a close tolerance relationship between the spacer element and chip to assure said proper placement, alignment and spacing of the chip relative to the PCB, including particularly the tolerance of its height that assures that all of the pins will project the same distances below the underneath surface of the PCB and that their ends will all fall in a common plane that is at least substantially parallel to said underneath surface.

Another characteristic of the invention is to provide with reference to the surface of the spacer element that contacts the underneath surface of the chip a properly formed surface and radius thereon that will allow the chip to maintain a parallel relationship with the PCB, i.e. reduce the chance that the chip will rock or tilt relative to the PCB, and prevent the spacer element from interfering with the adjacent surface of the chip or its adjacent pins.

An additional characteristic of the invention is to provide that the spacer element be made out of a crystalline thermoplastic polymer with a high melting point and formed as a small cylinder having opposite parallel flat chamfer sides and having very small radii between these sides and the adjacent portions of the spacer element.

The present invention also provides an improved method for mounting a chip package on a PCB, prior to securing the package on the PCB, for example by wave soldering, by the use of a spacer element inserted between the PCB and package.

DETAIL DESCRIPTION OF THE INVENTION

Figure 1:
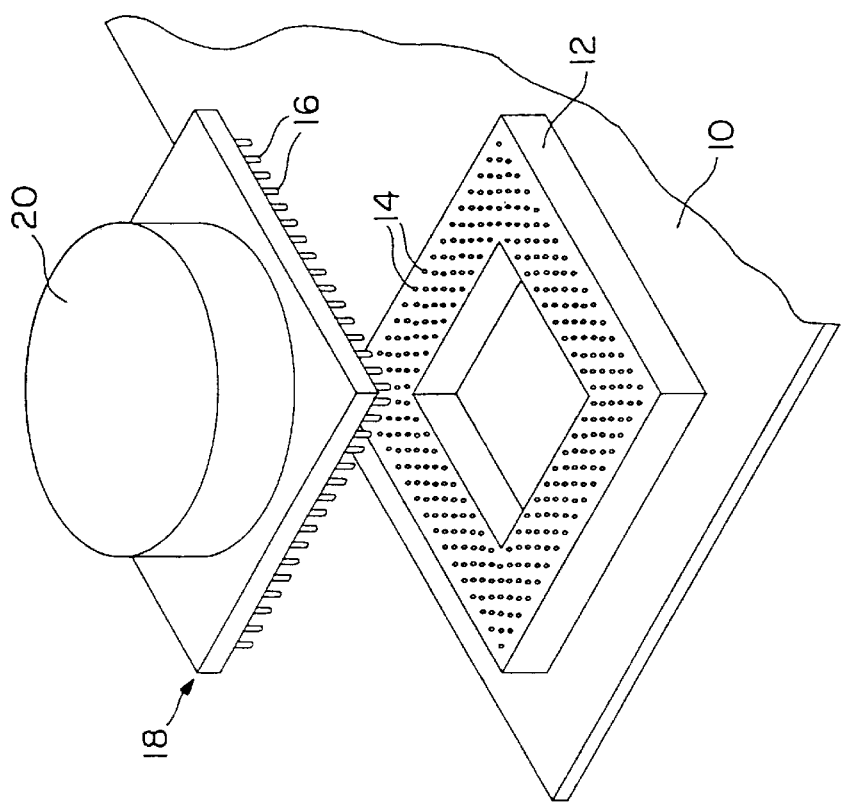
FIG. 1 is an exploded schematic isometric view of a prior arrangement illustrating the operative relationship of a chip, socket and PCB, only a part of the latter being shown.

With reference to FIG. 1, there is illustrated schematicly a well known arrangement of a PCB 10, to which a socket 12 has been previously wave soldered. The upper surface of the socket 12 is provided with a customary array of pin holes 14 into which a like number of corresponding electrical conducting pins 16 mounted on the underneath surface of a chip 18 are inserted. The illustrated chip 18 being a high powered processor type is provided with a heat sink assembly 20.

FIG. 1 can serve to illustrate some of the problems noted above associated with the use of a socket assembly mounting arrangement, particularly the difficulty in the placement, alignment and spacing of the socket relative to the PCB and the chip relative to the socket, which, as to the former and as has been noted previously, are also the same problems involved when the chip is mounted directly on the PCB. It is believed the placement and alignment problems are self apparent from the drawing. The spacing condition can be better appreciated in considering the difficulty in making sure the socket sits on the PCB or in the case of the design where the chip sits on the PCB, it sits on the PCB, in at least a substantially parallel manner with reference to the solder bridging condition. Also FIG. 1 allows the appreciation of the fact that any perimeter edges on the socket may allow the socket to rock or tilt relative to the PCB or the chip relative to the PCB in the second case in the absence of a spacer element of the present invention, as the case may be. Both of these conditions result in the pins not extending through the PCB in an equal manner and the creation of the aforementioned solder bridging condition.

As noted previously, FIGS. 2–8 serve to illustrate one form of the present invention. With reference first to FIG. 2, there is shown again a PCB 22 having an array of pin holes 24 into which a like number of electrical conducting pins 26 mounted on the underneath surface of a chip 28 are inserted. As in the case of the FIG. 1 assembly, the chip 28 is provided with a heat sink assembly 30. However, in the assembly of FIG. 2, instead of there being employed a socket interposed between the PCB 22 and the chip 28 a spacer element 32 is interposed.

Figure 3:
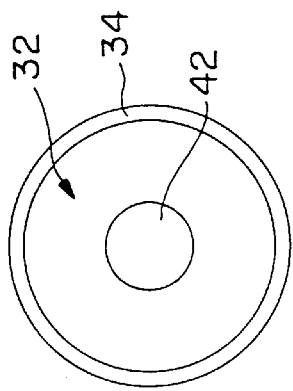
FIG. 3 is a plan view of the spacer element shown in FIG. 2, illustrated more in detail.
Figure 4:
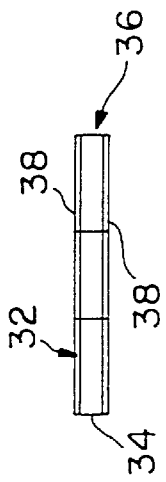
FIG. 4 is an elevational view of the spacer element shown in FIGS. 2 and 3.
Figure 5:
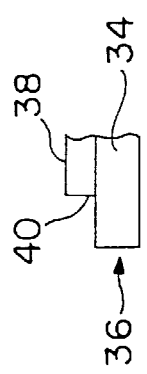
FIG. 5 is an enlarged partial view of one of the radii provided on the spacer element.

The spacer element 32 is best illustrated in FIGS. 3, 4 and 5, in which in the two former drawings it is shown that the element 32 takes the form of a small cylinder body portion 34 having a relatively short straight vertical side or body portion 36. The spacer element is made relatively symmetrically about its horizontal axis, as one views FIG. 4, in which its upper and lower at least substantially identical inwardly surfaces 38 are indented relative to the side outer edge of the 36 by very small radii 40, which terminate inwardly of the outer edge of side 36, best shown in FIG. 5, more about which will be said later. It will be noted that the offsets of the surfaces 38 relative to the body portion 34 in the vertical direction are very small when compared with the height of the side 36. A hole 42 is provided in the center of the element 32 for ease of handling during placement on the PCB, prior to the wave soldering operation.

The relationship of the dimensions of the spacer element relative to certain aspects of the PCB and chip are additional characteristics of the invention. In this regard, reference is made to FIGS. 5, 6 and 7. The height of the element 32 and its manufactured uniformity and relatively very smooth substantially flat surfaces, the surfaces being machined surfaces, are utilized in obtaining proper placement, alignment and spacing, as referred to above, of the chip relative to the PCB. In referring to FIG. 7, the reference legends X and Y serve to illustrate this accomplishment by indicating that the controlled height of the spacer element maintains the lower surface of the chip 28 at least substantially parallel to the upper surface of the PCB, as is indicated by X, and the lower surface of the chip at least substantially parallel to the extreme lower ends of the pins, as indicated by Y. The height of the spacer element is determined by the lengths of the pins and the desired distances the pins are to project through the PCB.

The reference above and hereinafter to "substantially flat and large surfaces", "relatively free of sharp corners", "substantially parallel upper and lower surfaces", "relatively thin body portion", "substantially indented surfaces", "relatively and/or substantially symmetrically" with respect to the surfaces, "generally uniform thickness", and "relative straight sides", is meant to describe, as an example and not as a limitation, machined surfaces, for example, the machined surfaces of an 150 SA material to be referenced later.

Figure 2:
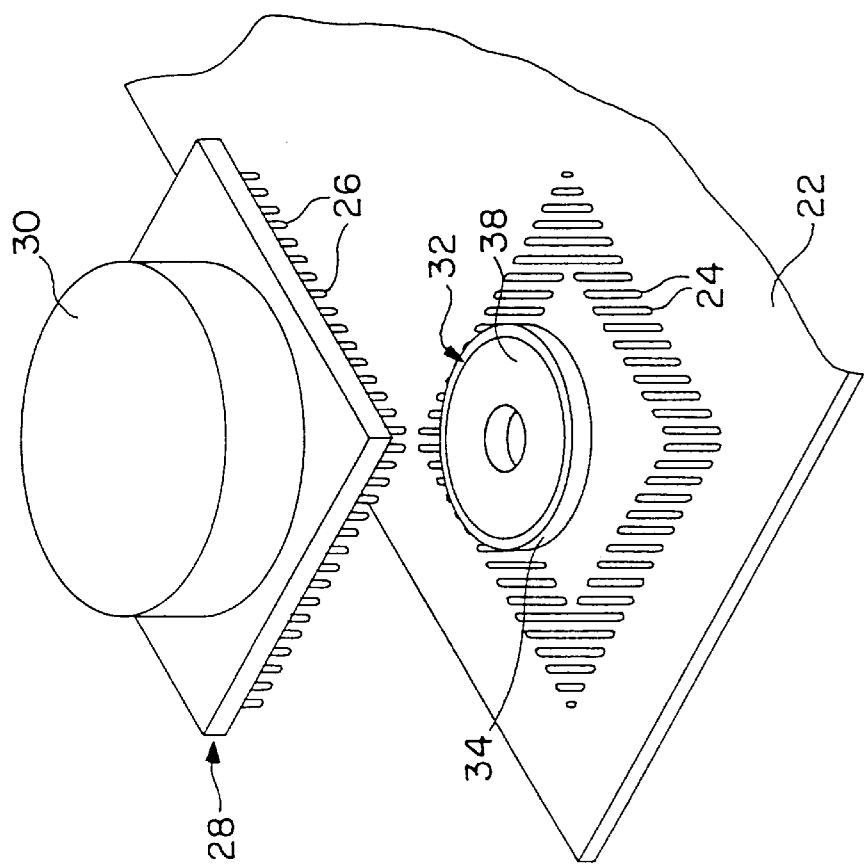
FIG. 2 is a view similar to FIG. 1, but illustrating the operative relationship of a chip, spacer element and PCB, these components being one aspect of the present invention, the spacer element thereof being shown arranged between the chip and PCB.

To enhance the function of the controlled height of the spacer element care is taken to machine relatively very smooth upper and lower surfaces 38 and to remove any relatively sharp or protruding corners or raised portions at the ends of the upper or lower surfaces 38 by providing the radii 40. As shown in FIG. 5, the radii are formed very small when compared with the diameters of the surfaces 38 and of the order in the illustrated embodiment of 0.05 mm max. In this way not only are the surfaces 38 kept flat, i.e., there being no undesirable edges, thereby preventing rocking or tilting of the chip relative to the PCB, but the construction avoids any interference between the spacer element 32 and the adjacent pins 26 of the chip 28, which could otherwise occur if the outer upper and outer lower corners of the element were allowed to exist. FIGS. 2 and 3 show that the surfaces 38 are relatively large but slightly smaller than the associated contiguous parts of the body portion 34, i.e., the parts that extend radially outwardly of the outer edges of the surfaces.

Figure 6:
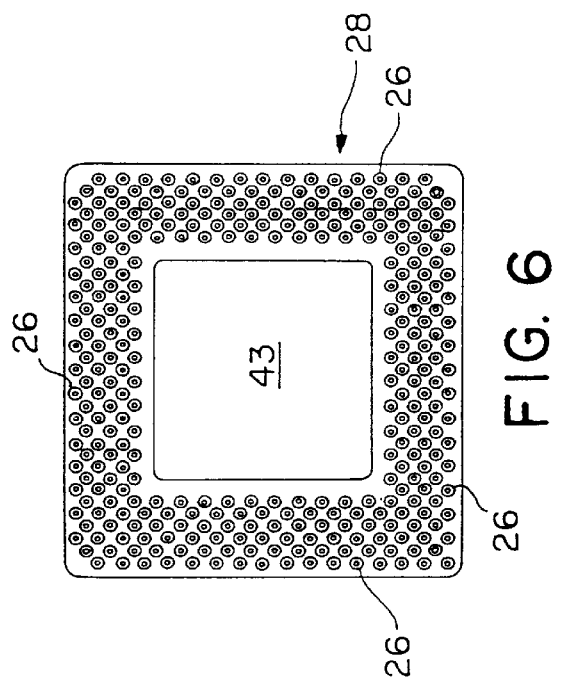
FIG. 6 is a plan view of the underneath side i.e., the pin side of the chip shown in FIG. 2.
Figure 7:
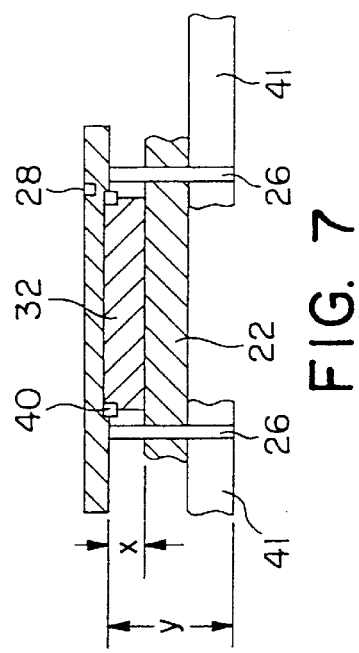
FIG. 7 is a sectional view taken through the assembly of FIG. 2, but taken from a view point when the components thereof are in their operative positions.

FIGS. 6 and 7 illustrate other characteristics of the invention. FIG. 6 shows the underneath surface of the chip 28, its array of pins 26 and its center portion 43, which takes the form of a square copper area, the construction and design of which features being well known. The perimeter lines in FIG. 6 representing the copper area also represent that the area is indented below the outer area of the chip where the pins are mounted. With reference to the area 42, the diameter of the spacer element 32 is dimensioned to fit relatively snugly into the area, in the form shown the clearance tolerance being of the order of 0.01 mm, for an element having a diameter of 24.13 mm, and a height of 2.41 mm.

The diameters of the upper and lower surfaces 38 are 21.59 mm and the vertical offset of each surface 38 from the body portion 34 is 0.30 mm. These dimensions may vary depending on the overall size of the spacer element and the operational conditions to which it is subjected. This construction allows the chip and particularly the area 42 to be quickly placed over the spacer element and held therein by the indented edges of the copper area 42. It will be appreciated that instead of the spacer element taken a cylindrical form, it may take other shapes as may the copper area 42, as long as the desired height dimension that controls the even spacing of the pins 26 is maintained. The reliance on the area 42 to position the spacer element on the PCB may be replaced by other means and methods, such as an adhering substance or external applied force or simply held on the PCB by its own weight. Before the chip is placed on the upper surface 38 of the spacer element 32, the element is placed by hand on the PCB 22, the PCB having in the usual manner silk screen art work that designates the area on the PCB where the chip is to be installed. The particular area that receives the spacer element is also defined by the open inside area surrounded by the array of pin openings 24 which also designates the exact area where the spacer element is to be placed. The contacting areas of the surfaces 38 relative to the overall underneath area of chip 28 and the surface provided for the chip on the PCB 22 are made large enough to adequately support the chip in the desired parallel condition relative to the PCB during the wave soldering operation.

The operative relationship of the chip 28, spacer element 32 and PCB 22 can be seen in FIG. 7. In addition to the assurance of proper alignment of the pins with the holes and parallel condition that the spacer element maintains between the chip and PCB, the benefit of the radii 40 in avoiding interference with the adjacent pins 26 and the uniform extensions of the pins 26 below the underneath surface of the PCB can be seen. FIG. 7 also indicates by the reference character 41 the solder being applied by a wave soldering process. As noted previously, the use of the disclosed spacer elements allow the use of existing designed chips without the need of any alteration thereof.

The spacer element 32 preferably is formed from an acetal material extruded from a crystalline thermoplastic polymer with a relatively high melting point. One such type may be an acetal material known by the registered trademark "DELRIN" owned by E. I. du Pont de Nemours & Company of Wilmington, Del. and sold in an industrial product form by the A. L. Hyde Company of Grenlock, N.J. The preferred choice is the "DELRIN" 100 series having a du Pont 150 SA product grade designation and utilizing the well known properties of such material in the form of an extrusion product from which the spacer element is machined. This product is selected because of its characteristics and/or properties of relatively high viscosity, relatively high rigidity, relatively high and excellent resistance to moisture and chemicals, relatively high dimensional stability, relative ease of fabrication, relatively high natural lubricity, and relatively high melting point and wide useful temperature in air characteristics of between approximately 60° F. to approximately 320° F. These properties are selected both for their benefits in the manufacturing of the spacer element and in its use as a spacer means when subject to the conditions of present day wave soldering processes.

With reference to the 150 SA type and grade material, the following typical property values are given as follows:

| PROPERTIES | ASTM | UNITS | 150 SA |
| --- | --- | --- | --- |
| Flexural Strength | D790 | PSI | 14,300 |
| Flexural Modulus | D790 | PSI | 380,000 |
| Rockwell Hardness | D785 | Scale R–M | R-120 M-94 |
| Impact Strength (Notched) | D256 | ft. – lbs./in. | 2.3 |
| Wear Factor Against Steel | — | $10^{-10}$ in.$^3$min./ft./lb./hr. | 65 |
| Coefficient of Friction | — | 40 PSI 50 FPM | 0.20 |
| Heat Deflection @ 66 PSI | D648 | °F. | 342 |
| Heat Deflection @ 264 PSI | D648 | °F. | 277 |
| Coefficient of Linear Thermal Expansion | D696 | in./in./°F. | $6.8 \times 10^{-5}$ |
| Short Term Maximum Service Temperature | — | °F. | 300 |
| Long Term Maximum Service Temperature | — | °F. | 200 |

While an acetal material is the preferred material for the spacer element, other material such as a nylon based material can be used when adapted to perform satisfactory during the wave soldering process. The reference to the above characteristics and/or properties hereinafter as being "relatively high" is meant to describe, as and example and not as a limitation, the characteristics and/or properties given above of the 150 SA material.

The spacer element 32 is designed to enable the chip 28 to be quickly and dependably placed on the PCB 22 when passing through the preparation line prior to the wave soldering station where the pins of the chip are soldered to the circuitry of the PCB. As noted, the PCB, in the usual manner, is provided with silk screen art work designating the area on the PCB where the chip is to be secured. This is the area in which a person working on the board line will simply place by hand the spacer element on the designated area.

As noted, this is done in an assembly line fashion, in which for each PCB a spacer element is placed by hand on its associated PCB followed by a hand installed chip. In doing this, the copper area 42 of the chip when placed over the upper surface 38 of the spacer element 32 having a close tolerance relationship therewith centers the chip on the spacer element and hence on the PCB and automaticly aligns the pins 26 of the chip with the holes 24 of the PCB, in a manner that the tail ends of the pins will extend equal distances from the underneath surface of the PCB. The fact that the element is symmetrically formed and the two surfaces 38 are identical allow the surfaces to be used interchangeably with either the chip or PCB.

Figure 8:
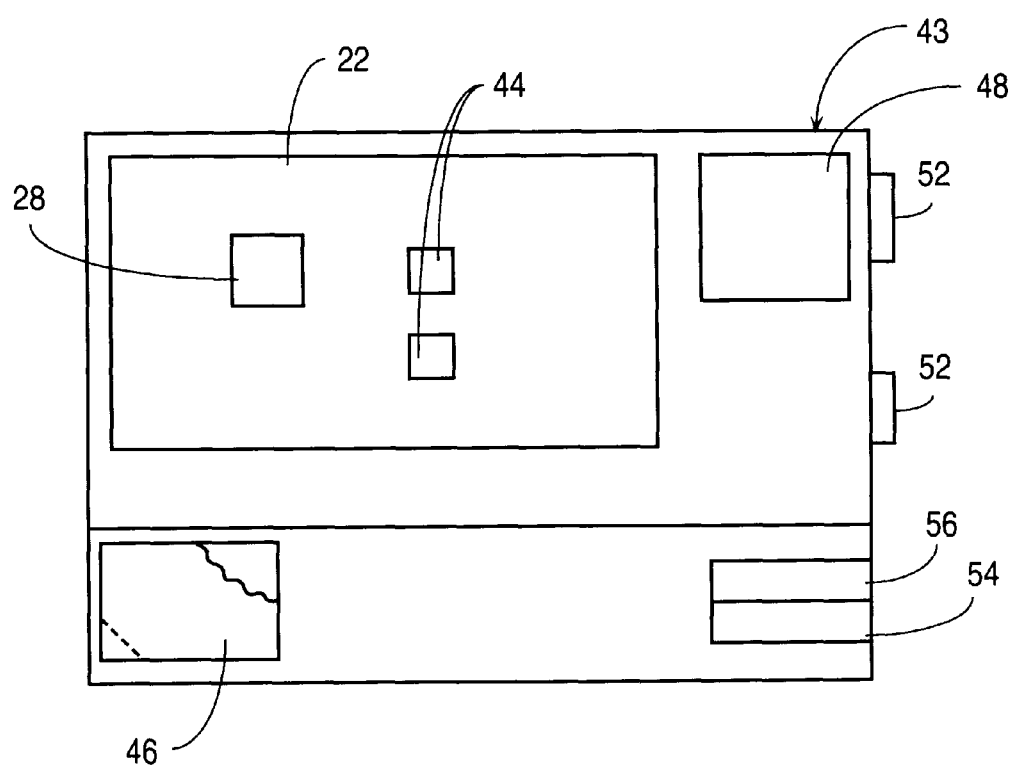
FIG. 8 is a schematic plan view of a computer box and certain of its major components, including the PCB, spacer and chip shown in FIG. 2.

With reference now to FIG. 8, a computer box 43 with its cover removed is shown. The box 43 is dimensioned to receive the PCB 22 with the spacer element 32 interposed between it and the processor chip 28 shown mounted on the PCB in its operative position. The box and PCB in the usual manner also includes, among other standard components, memory units 44, a hard drive 46, power unit 48, input and output units 52, a CD Rom drive 54 and two of the necessary control boards 56.

In accordance with the provisions of the patent statutes, we have explained our invention in terms of its preferred embodiment, however, it will be readily understood by those skilled in the art to which the invention pertains that it may be practiced otherwise than illustrated and described.

We claim:

1. A combination of a PCB, a computer chip and a spacer element, said PCB comprising a relatively flat side having a generally uniform thickness, said PCB having an array of pin holes extending through said thickness, said chip comprising a relatively flat side and an array of electrical conducting pins extending therefrom constructed to pass into and through a different one of said holes of said PCB, said pins having outer ends, said outer ends constructed to extend at least substantially equal distances from said chip, said spacer element comprising a first surface arranged to engage said flat side of said PCB, said spacer element comprising a second surface arranged to engage said flat side of said chip, said first and second surfaces of said spacer element being constructed to maintain said flat side of said chip at least generally parallel to said flat side of said PCB and said outer ends of said pins at least generally equal distances from said flat side of said PCB, said first and second surfaces of said spacer element being constructed as substantially flat surfaces, said spacer element having a body portion of generally uniform thickness throughout substantially its entire length, said first and second surfaces being constructed on opposite sides of said body portion in a manner to cause said first and second surfaces thereof to be at least substantially parallel to each other, said thickness being a function of the lengths of said pins and the distances said pins project beyond said PCB, said body portion being constructed as a relatively thin cylinder having a cylindrical side and said first and second surfaces of said body portion being constructed as upper and lower generally identical circular surfaces, said upper and lower surfaces each constructed to be indented from said cylindrical side to form indented ends at each terminus of said upper and lower surface, and radii constructed at each said indented end inwardly of said cylindrical side.

2. A combination of a PCB, a computer chip and a spacer element, said PCB comprising a relatively flat side having a generally uniform thickness, said PCB having an array of pin holes extending through said thickness, said chip comprising a relatively flat side and an array of electrical conducting pins extending therefrom constructed to pass into and through a different one of said holes of said PCB, said pins having outer ends, said outer ends constructed to extend at least substantially equal distances from said chip, said spacer element comprising a first surface arranged to engage said flat side of said PCB, said spacer element comprising a second surface arranged to engage said flat side of said chip, said first and second surfaces of said spacer element being constructed to maintain said flat side of said chip at least generally parallel to said flat side of said PCB and said outer ends of said pins at least generally equal distances from said flat side of said PCB, said first and second surfaces of said spacer element being constructed as substantially flat surfaces, said spacer element having a body portion of generally uniform thickness throughout substantially its entire length, said first and second surfaces being constructed on opposite sides of said body portion in a manner to cause said first and second surfaces thereof to be at least substantially parallel to each other, said thickness being a function of the lengths of said pins and the distances said pins project beyond said PCB, said array of pins being located in an outer area of said chip and arranged around an inner area of said chip, said inner area constructed to be recessed relative to said outer area and having a perimeter edge defining said inner area, said first and second surfaces of said spacer element being dimensioned to assume a close tolerance relationship with said perimeter edge, in which either one or the other of said first or second surfaces of said spacer element are receivable, said array of holes being located in an outer area of a portion of said PCB relative to an inner area of said PCB, said inner area of said PCB being dimensioned to receive one or the other of said first and second surfaces of said spacer element, and said spacer element being constructed out of a thermoplastic polymer with a relatively high melting point.

3. A combination according to claim 2, wherein said melting point is between approximately 60° F. to approximately 320° F., and said thermoplastic polymer having one or more of the following characteristics: relatively high viscosity, relatively high rigidity, relatively high resistance to moisture, relatively high dimensional stability and relatively high natural lubricity.

4. A combination according to claim 3, wherein said thermoplastic polymer is of an acetal material.

5. A combination of a PCB, a computer chip and a spacer element, said PCB comprising a relatively flat side having a generally uniform thickness, said PCB having an array of pin holes extending through said thickness, said chip comprising a relatively flat side and an array of electrical conducting pins extending therefrom constructed to pass into and through a different one of said holes of said PCB, said pins having outer ends, said outer ends constructed to extend at least substantially equal distances from said chip, said spacer element comprising a first surface arranged to engage said flat side of said PCB, said spacer element comprising a second surface arranged to engage said flat side of said chip, said first and second surfaces of said spacer element being constructed to maintain said flat side of said chip at least generally parallel to said flat side of said PCB and said outer ends of said pins at least generally equal distances from said flat side of said PCB, said first and second surfaces of said spacer element being constructed as substantially flat surfaces, said spacer element having a body portion of generally uniform thickness throughout substantially its entire length, said first and second surfaces being constructed on opposite sides of said body portion in a manner to cause said first and second surfaces thereof to be at least substantially parallel to each other, said thickness being a function of the lengths of said pins and the distances said pins project beyond said PCB, said body portion includes a cylindrical body portion, said cylindrical body portion having an outer edge relative to said flat surfaces thereof, said flat surfaces of said body portion being indented inwardly from said outer edge of said body portion and joined to said body portion by relatively small radii and relatively free of corner protrusions of said outer edge, and said radii being dimensioned to allow said radii to terminate inwardly of said outer edge.

6. A spacer element for use with a computer chip and PCB, comprising a body portion, said body portion having a first generally flat surface formed to engage the chip and a second generally flat surface formed to engage the PCB, said first and second surfaces constructed to be generally parallel to each other, said body portion having a generally uniform thickness throughout substantially its entire length, said first and second surfaces being formed as substantially large surfaces but slightly smaller than the associated contiguous parts of said body portion, said body portion having a side having a height dimension, and said surfaces being offset in a direction normal from said side of said body portion by a relatively small amount when compared with the height dimension of said side of said body portion.

7. A spacer element in accordance with claim 6, wherein said body portion is cylindrical in shape and has a major axis, and wherein said flat surfaces are arranged at least substantially symmetrically about said major axis and have outer ends, said body portion having an inner body portion, wherein said outer ends of said flat surfaces are indented inwardly from the outer edge of said cylindrical shape body and joined to said inner body portion by relatively small radii, and relatively free of corner protrusions of said outer edge, and said radii being dimensioned to allow said radii to terminate inwardly of said outer edge.

* * * * *